United States Patent
Shah

(12) 
(10) Patent No.: US 6,703,642 B1
(45) Date of Patent: Mar. 9, 2004

(54) SILICON CARBIDE (SIC) GATE TURN-OFF (GTO) THYRISTOR STRUCTURE FOR HIGHER TURN-OFF GAIN AND LARGER VOLTAGE BLOCKING WHEN IN THE OFF-STATE

(75) Inventor: Pankaj B. Shah, Silver Spring, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/499,650

(22) Filed: Feb. 8, 2000

(51) Int. Cl.⁷ ...................... H01L 31/0312; H01L 29/74
(52) U.S. Cl. .......................... 257/77; 257/147; 257/148
(58) Field of Search ............................ 257/77, 147–153

(56) References Cited

U.S. PATENT DOCUMENTS

| | | | | |
|---|---|---|---|---|
| 5,132,767 A | * | 7/1992 | Ogura et al. | 257/153 |
| 5,831,289 A | * | 11/1998 | Agarwal | 257/77 |
| 6,274,892 B1 | * | 8/2001 | Kub et al. | 257/131 |

FOREIGN PATENT DOCUMENTS

| | | | | |
|---|---|---|---|---|
| JP | 4-130773 | * | 5/1992 | H01L/29/74 |

OTHER PUBLICATIONS

4H–SiC Gate Turn–Off Thyristor Designs for Very High Power Control, P.B. Shad, B.R. Geil, K.A. Jones, T.E. Griffin & M.A. Derenge International Conference on Silicon Carbide and Related Materials —99.

two–dimensional Numerical Investigation of the Impact of Material–Parameter Uncertainty on the Steady–State Performance of Passivated 4H–SiC Thyristors, Journal of Applied Physics, vol. 84, No. 9, Oct. 15, 1998.

Punchthrough Type GTO with Buffer Layer and Homogeneous Low Efficiency Anode Structure, S.Eicher, F. Bauer, A. Weber, H.R. Zeller and W. Fichtner, IEEE 1996.

4H–SIC Power Devices For Use In Power Electronic Motor Control, J.B. Casady, A.K. Agarwal, S. Seshadri, R.R. Siergielj, L. B. Rowland, M.F. MacMilland, D.C. Sheridan & P.A. Sanger, Solid–State Electronics, vol. 42, No. 12, pp. 2165–2176, 1998.

Turn–On Process in 4H–SiC Thyristors, IEEE Transactions on Electro Devices, vol. 44 No. 7/97, Michael E. Levinshtein, John W. Palmour, Sergey L. Rumyanetsev & Ranbir Singh.

Design Considerations for p–I–n Thyristor Structures, IEEE Transactions on Power Electronics, vol. 7 No. 2, 4/92, Ranadeep Dutta & Allen Rothwarf.

700–V Asymmetrical 4H–SiC Gate Turn–Off Thyristors (GTO's), A.K. Agarwal, Jeffrey B. Casady, L. B. Rowland, S. Seshadri, R.R. Siegiej, W.F. Valek & C.D. Brandt, IEEE vol. 18 No. 11 11/97.

Characterization of 4H–SiC Gate Turn–Off Thyristor, Lihui Cao, Binghui Li, Jianh. Zhao, Solid–State Electronics 44 (2000) pp 347–352.

* cited by examiner

*Primary Examiner*—Ori Nadav
(74) *Attorney, Agent, or Firm*—Mark D. Kelly; Edward L. Stolarun

(57) ABSTRACT

A SiC gate turn-off (GTO) thyristor that exhibits improved greatly performance includes a p-type anode region, a n-type gated base region positioned beneath the anode region, a n-type drift region positioned beneath the gated base region and doped to a lower concentration of donors than that of the gated base region, a p-type buffer region positioned beneath the n-type drift region and doped with acceptors to a concentration whose magnitude lies between the doping concentration of the anode region and the drift region, and an n-type substrate positioned beneath the buffer region. In another aspect of the invention of this application, a silicon or silicon carbide gate-turn-off thyristor includes a GTO thyristor structure with a thick buffer layer having a high, free-carrier recombination rate.

9 Claims, 7 Drawing Sheets

SILICON CARBIDE (SIC) GATE TURN-OFF (GTO) THYRISTOR STRUCTURE FOR HIGHER TURN-OFF GAIN AND LARGER VOLTAGE BLOCKING WHEN IN THE OFF-STATE

This invention relates to an improvement in the design of high power, high temperature switches, more specifically, SiC gate turn off (GTO) thyristors. Conventional SiC GTO thyristors typically have a drift region made of p-type rather than n-type material adjacent to an n-type region with gate contacts. Conventional SiC GTO thyristor structures also typically have a thin highly doped p-type buffer layer below the relatively thick, low level p-type drift region. This is known as an asymmetrical GTO (gate turn-off) thyristor structure. Thyristors typically use complementary dopants for the drift region and the gated base region to create a pn junction between the two regions (i.e., if the drift region is p-type then the gated base region is n-type and vice versa.)

Examples of various conventional SiC GTO thyristors can be found in U.S. Pat. No. 5,831,289 to A. K. Agarwal, entitled "Silicon carbide gate turn-off thyristor arrangement;" U.S. Pat. No. 5,539,217 to J. A. Edmond, J. W. Palmour entitled, "Silicon carbide thyristor;" M. E. Levinshtein, J. W. Palmour, S. L. Rumyanetsev, and R. Singh, "Turnon process in 4H-SiC Thyristors," *IEEE Trans. Elect. Dev.* Vol 44, p. 1177, 1997; K. Xie, J. H. Zhao, J. R. Flemish, T. Burke, W. R. Buchwald, G. Lorenzo, and H. Singh, "A high current and high temperature 6H-SiC thyristor," *IEEE Elect. Dev. Lett.*, vol. 17, p 142, 1996; P. B. Shah and K. A. Jones, "Two-dimensional numerical investigation of the impact of material-parameter uncertainty on the steady-state performnance of passivated 4H-SiC thyristors," *J Appl. Phys.*, vol. 84, p. 4625, 1998; J. B. Casady, A. K. Agarwal, S. Seshadri, R. R. Siergiej, L. B. Rowland, M. F. Macmillan, D. C. Sheridan, P. A. Sanger, and C. D. Brandt., "4H SiC power devices for use in power electronic motor control," *Solid State Electronics*, vol. 42, p. 2165, 1998; and A. K. Agarwal, J. B. Casady, L. B. Rowland, S. Seshadri, R. R. Siergiej, W. F. Valek, and C. D. Brandt, "700 V Asymmetrical 4H-SiC Gate Turn-Off Thyristors (GTO), *IEEE Elect. Dev. Lett.*, vol. 18, p. 518, 1997.

BACKGROUND

Silicon GTO thyristors have been commercially available since the 1960s. However they are not able to operate at the high temperatures that silicon carbide GTO thyristors can. Also silicon carbide GTO thyristors should be able to block larger voltages in the off-state, and conduct higher current densities in the on state than silicon GTO thyristors. These are the reasons for making GTO thyristors out of silicon carbide. However, because of material issues, the optimum structure for silicon GTO thyristors cannot be used for silicon carbide GTO thyristors. Thus, new designs are needed.

SiC GTO thyristors have only recently come of age because of the difficulty in producing good SiC. They are, for the most part, still only being used experimentally. A very intense effort is, however, underway in research laboratories throughout the world to improve the quality of SiC and the performance of SiC GTO thyristors. Ordinary silicon GTO thyristors are widely used in high power conditioning circuits, in high voltage DC systems, and in traction circuits. Other applications include motor control, power factor control, and other power conditioning circuits. Such systems are finding increased military applications and will be found in future electric or hybrid electric tanks, electric helicopters, and other vehicles used by the Army.

A thyristor is made up of layers of alternately doped n-type and p-type material. N-type and p-type refer to the majority carriers that are present in the region. In an n-type region "electrons" are the majority carriers of charge, and in a p-type region "holes" (the absence of electrons) are the majority carriers of charge. To make a region n-type, additional nitrogen atoms or "impurities" (donors, $N_D$) are typically added to the SiC crystal. To make a region p-type, aluminum impurities (acceptors, $N_A$) are typically added to the SiC crystal. The alternating semiconductor layers of the thyristor, in effect, make up two three-layer combinations where each is equivalent to a bipolar junction transistor. When the sum of the forward current gain across the two three layer combinations is greater than one, the thyristor will latch on and current will flow from anode to cathode. The thyristor will stay on until the anode to cathode current is interrupted.

The GTO thyristor has been a particularly successful design since it overcomes the problem of switching off anode to cathode current. A GTO thyristor can be switched on by a gate current of one polarity and switched off by a gate current of the opposite polarity. Known SiC GTO thyristors, are multi-layer pnpn devices. They have limited turn-off gain and turn-off speed and voltage blocking performance is limited as well.

OBJECTS OF THE INVENTION AND SUMMARY

Accordingly, it is a primary object of the present invention to provide a SiC GTO thyristor that has improved performance characteristics such as turn-off gain and turn off speed and voltage blocking and at the same time be highly reliable and inexpensive to manufacture and produce.

The foregoing objects are achieved, at least in part by a silicon carbide gate-turn-off thyristor that includes a p-type anode region, a n-type gated base region positioned beneath the anode region, a n-type drift region positioned beneath the gated base region and doped to a lower concentration of donors than that of the gated base region, a p-type buffer region positioned beneath the n-type drift region and doped with acceptors to a concentration whose magnitude lies between the doping concentration of the anode region and the drift region, and an n-type substrate positioned beneath the drift region. In another aspect of the invention of this application, a silicon or silicon carbide gate-turn-off thyristor includes a GTO thyristor structure with a thick buffer layer having a high, free-carrier recombination rate.

BRIEF DESCRIPTION OF THE DRAWINGS

The foregoing objects and advantages of the present invention will be more fully understood from the following detailed description having reference to the appended drawings wherein.

DETAILED DESCRIPTION OF THE INVENTION

Figure 1:
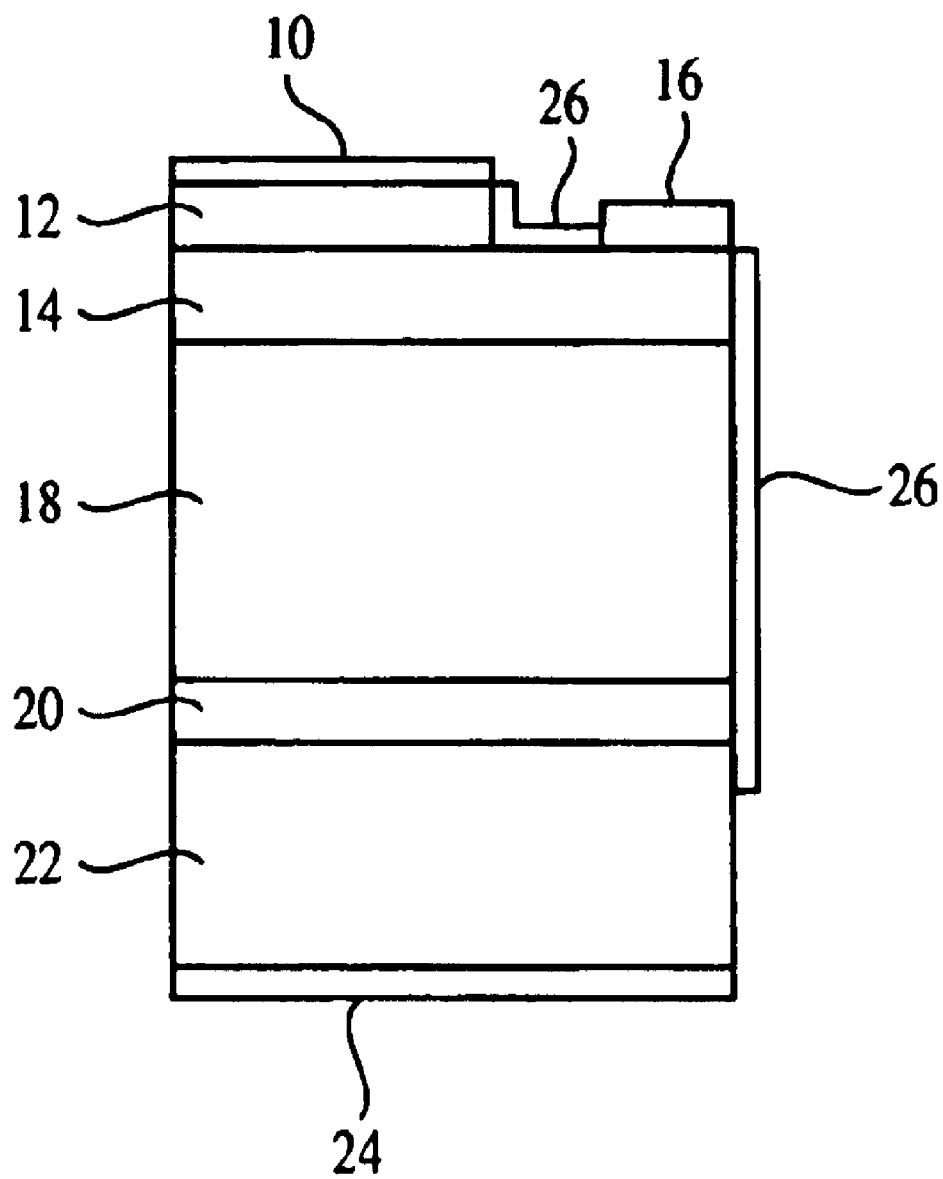
FIG. 1 shows a cross section of a typical asymmetric SiC GTO thyristor structure.

A typical asymmetric GTO thyristor structure is shown in FIG. 1. The device includes an anode contact 10, a p-type anode region 12 beneath contact 10, an n-type gated base region 14 lying beneath anode region 12, a gate contact 16 positioned on top of the part of gated base region 14 not covered by anode region 12, a p-type drift region 18 beneath gated base region 14, a highly doped p-type buffer layer 20 beneath drift region 18, an n-type substrate 22 beneath buffer layer 20 and a cathode contact 24 beneath n-type substrate 22. Typical dopant concentrations and thicknesses for prior art SiC GTO thyristors such as the device of FIG. 1, are shown in Table 1, below.

TABLE 1

| Region number | Dopant concentration | Thickness |
|---|---|---|
| 12 | $N_A = 1 \times 10^{19}$ cm$^{-3}$ | 2 μm |
| 14 | $N_D = 1 \times 10^{18}$ cm$^{-3}$ | 1 μm |
| 18 | $N_A = 1 \times 10^{15}$ cm$^{-3}$ | 3 μm |
| 20 | $N_A = 3 \times 10^{17}$ cm$^{-3}$ | 1 μm |
| 22 | $N_D = 5 \times 10^{17}$ cm$^{-3}$ | Substrate (300 μm) |

Figure 2:
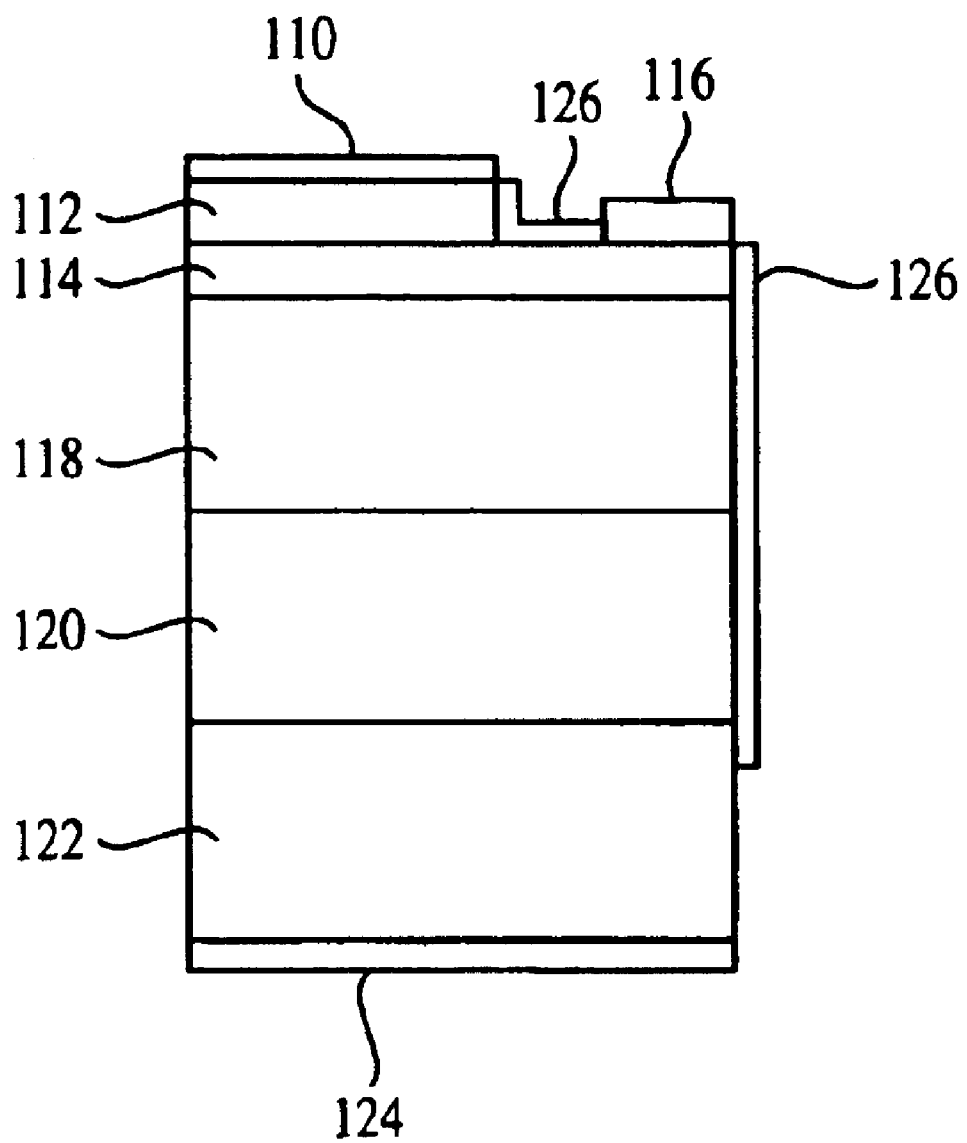
FIG. 2 shows a cross section of the structure of a preferred embodiment of the invention of this application.

A preferred embodiment of the invention of this application is shown in FIG. 2. The embodiment includes an anode contact 110, a p-type anode region 112 beneath anode contact 110, a highly doped n-type gated base region 114 lying beneath anode region 112, a gate contact 116 positioned on top of the part of gated base region 114 not covered by anode region 112, a low doped n-type region 118 beneath gated base region 114, a p-type buffer region 120 beneath drift region 118, an n-type substrate 122 beneath buffer layer 120 and a cathode contact 124 beneath n-type substrate 122. Preferred dopant concentrations and thicknesses for the device of FIG. 2 are shown in Table 2, below.

TABLE 2

| Region number | Dopant concentration | Thickness |
|---|---|---|
| 112 | $N_A = 1 \times 10^{19}$ cm$^{-3}$ | 2 μm |
| 114 | $N_D = 1 \times 10^{18}$ cm$^{-3}$ | 1 μm |
| 113 | $N_D = 1 \times 10^{15}$ cm$^{-3}$ | 3 μm |
| 120 | $N_A = 3 \times 10^{17}$ cm$^{-3}$ | 4 μm |
| 122 | $N_D = 5 \times 10^{17}$ cm$^{-3}$ | Substrate (300 μm) |

As can be seen, doping for the regions of the embodiment shown in FIG. 2 are conventional except for the drift region which is now n-type instead of p-type. Various other concentrations are, of course, also possible. The following ranges would be typical, with the exact concentrations to be selected depending on design considerations familiar to those of ordinary skill in the art: for p-type anode region 112, $N_A > 1 \times 10^{19}$ cm$^3$; n-type gated base region 114, $1 \times 10^{16} < N_D < 5 \times 10^{18}$; n-type drift region 118, $N_D < 4 \times 10^{16}$; p-type buffer region 120, $1 \times 10^{17} < N_A < 1 \times 10^{19}$; n type substrate 122, $N_D < 5 \times 10^{18}$ is best though $N_D$ can be higher. As with all SiC GTO thyristors, the devices should be passivated by depositing a passivation material on all exposed silicon carbide surfaces, such as silicon dioxide layers 26 and 126 shown in FIGS. 1 and 2, respectively.

Operation

The devices operate in essentially the same way. In the on-state, current flows from the anode to the cathode. The thyristor (pnpn structure) can be modeled as two bipolar transistors (a pnp and an npn transistor) coupled such that the collector current of one is the base drive current of the other. This coupling leads to a feedback mechanism that causes all the junctions to be forward biased at high currents. To turn off the GTO thyristor, a reverse bias pulse is applied at the gate contact. The reverse bias current extracts majority carriers from the gate region and this in turn through charge neutrality, also causes the minority carriers in the vicinity of the gate region to be removed. This initially breaks the thyristor action in the regions nearest the gate contacts. The current flowing in the device from anode to cathode is squeezed and forced to flow through a narrower region along the n+/p junction between regions 14 and 18, or the n+/n junction between regions 114 and 118 in the invention. The portion of the thyristor closest to the gate contact turns off first, and as the gate pulse increases, the off region extends further from the gate contact along this junction. This process squeezes the anode-cathode current flow even more until the feedback is broken, the thyristor action ceases, and the GTO thyristor turns off. Unlike prior art devices, in the invention of this application current squeezing takes place along the n+/n junction.

Figure 3:
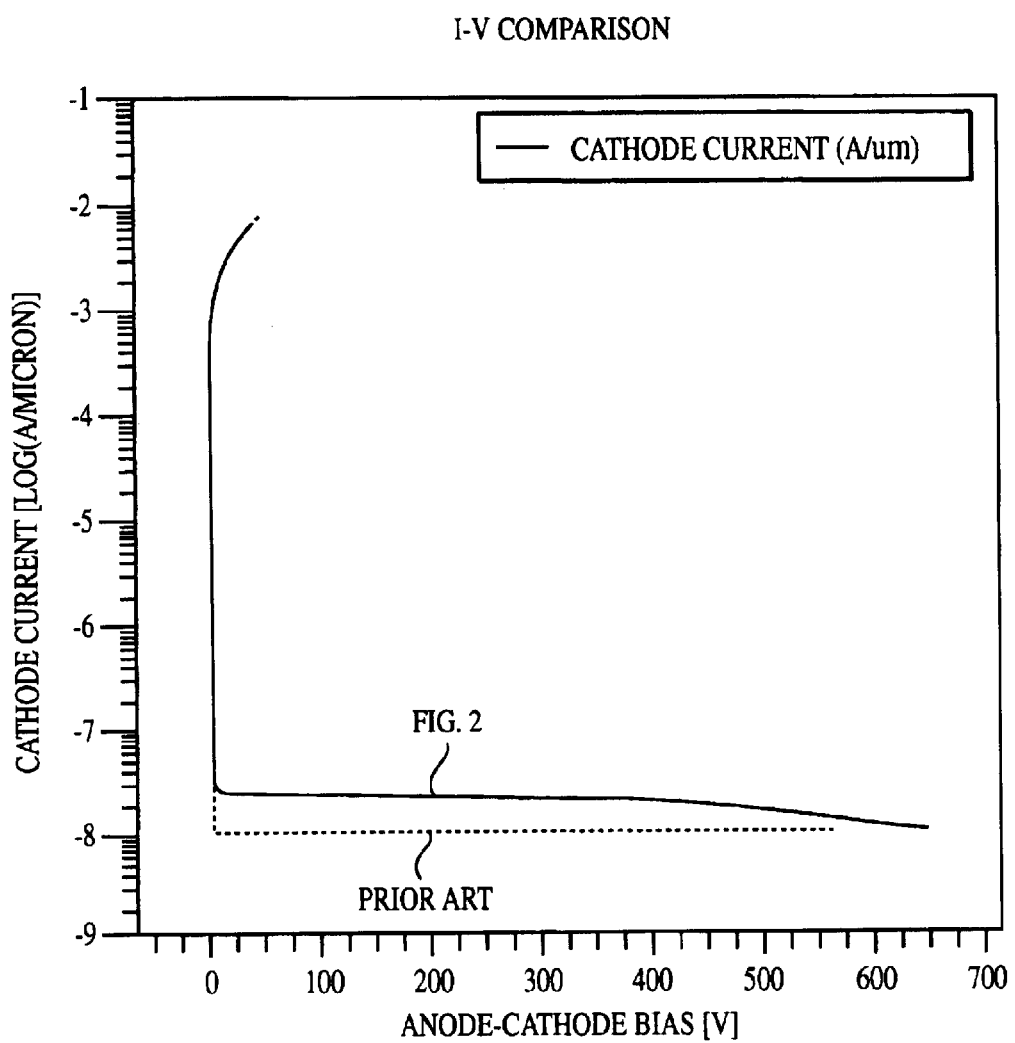
FIG. 3 shows a graph of the steady state current-voltage characteristics of both the prior art and a preferred embodiment of the invention as shown in FIG. 2.
Figure 4:
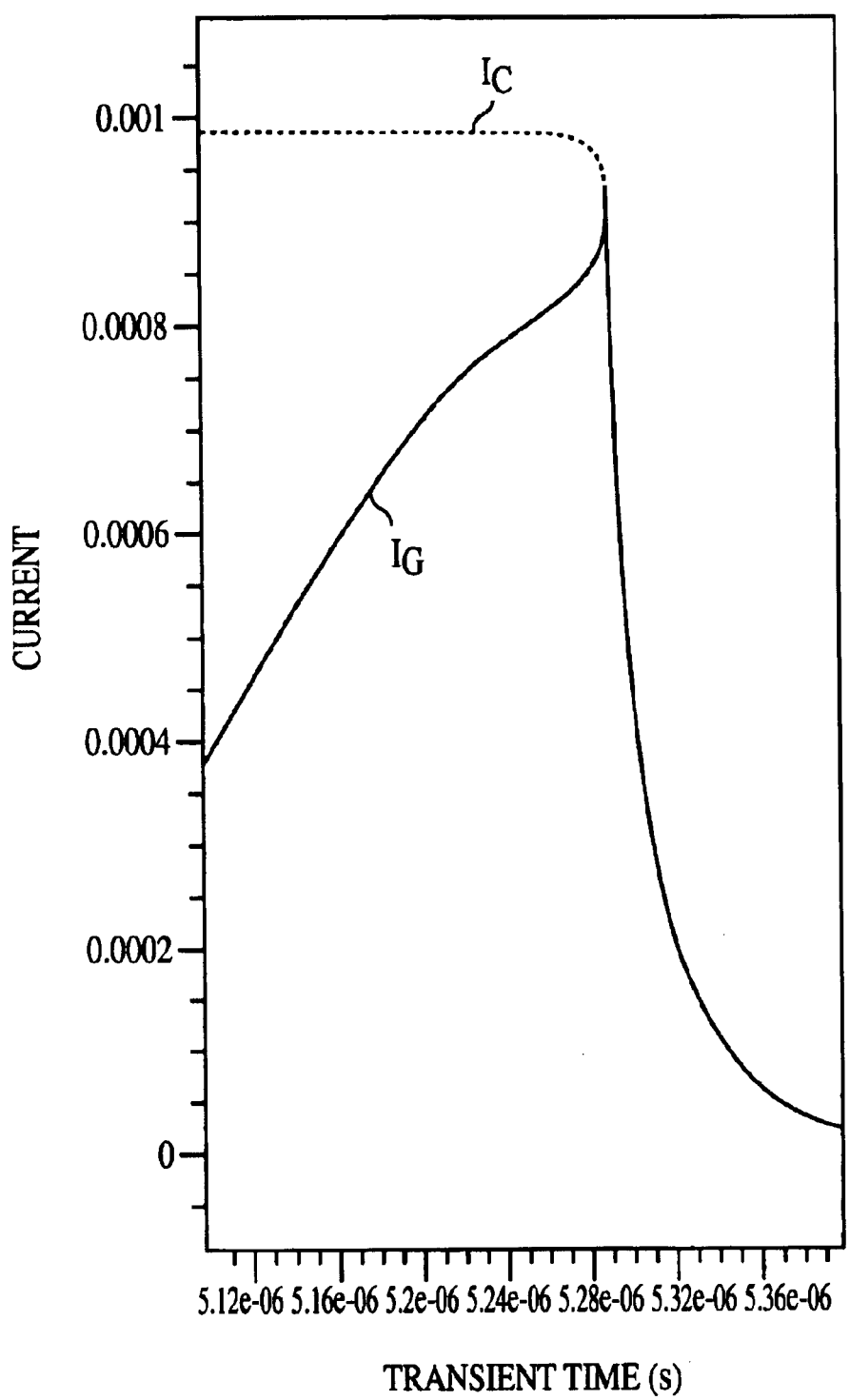
FIG. 4 shows a graph of the turn-off gain and turn-off time seen with conventional devices.
Figure 5:
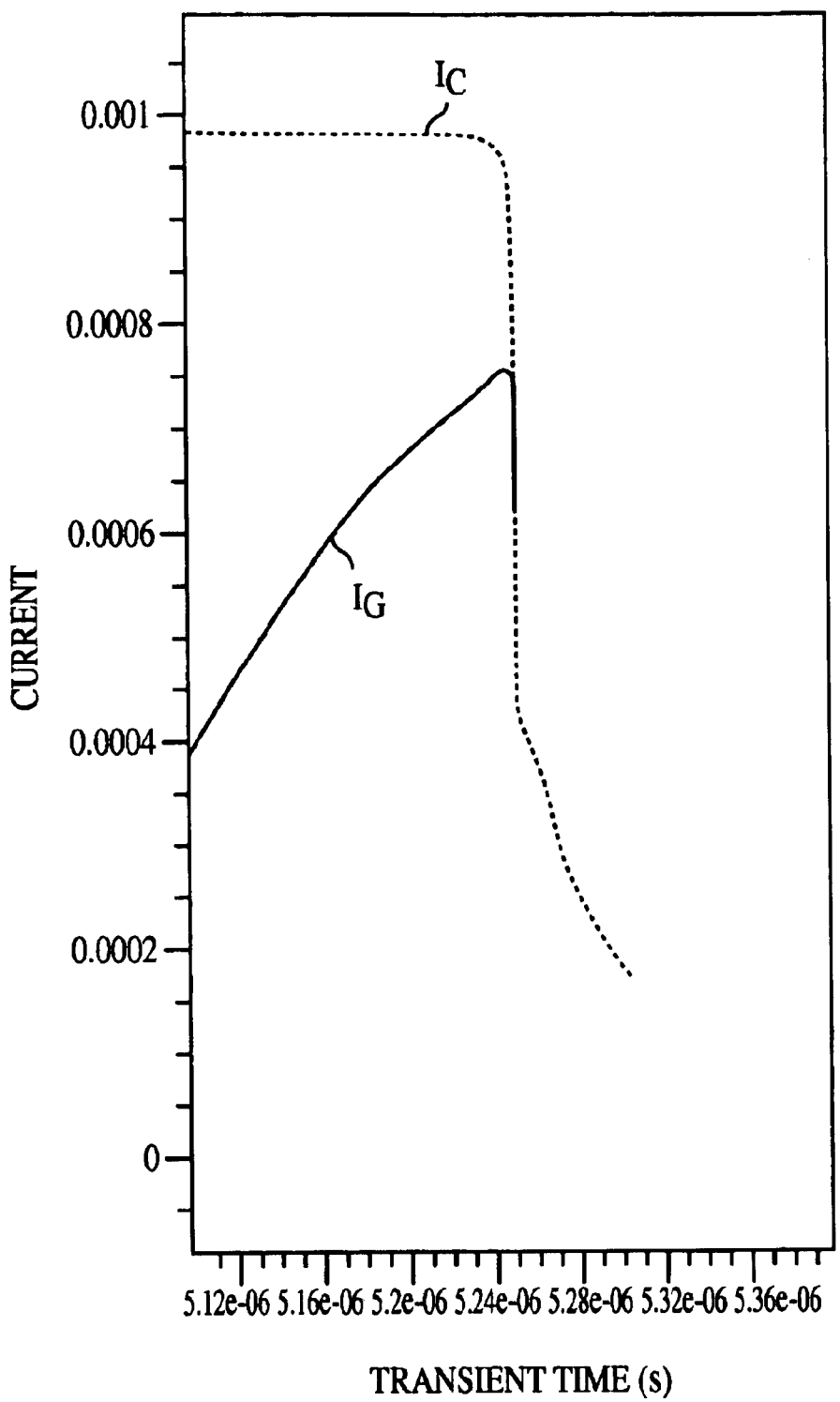
FIG. 5 shows a graph of the improved turn-off gain and turn-off time seen with a preferred embodiment of the invention as shown in FIG. 2.
Figure 6:
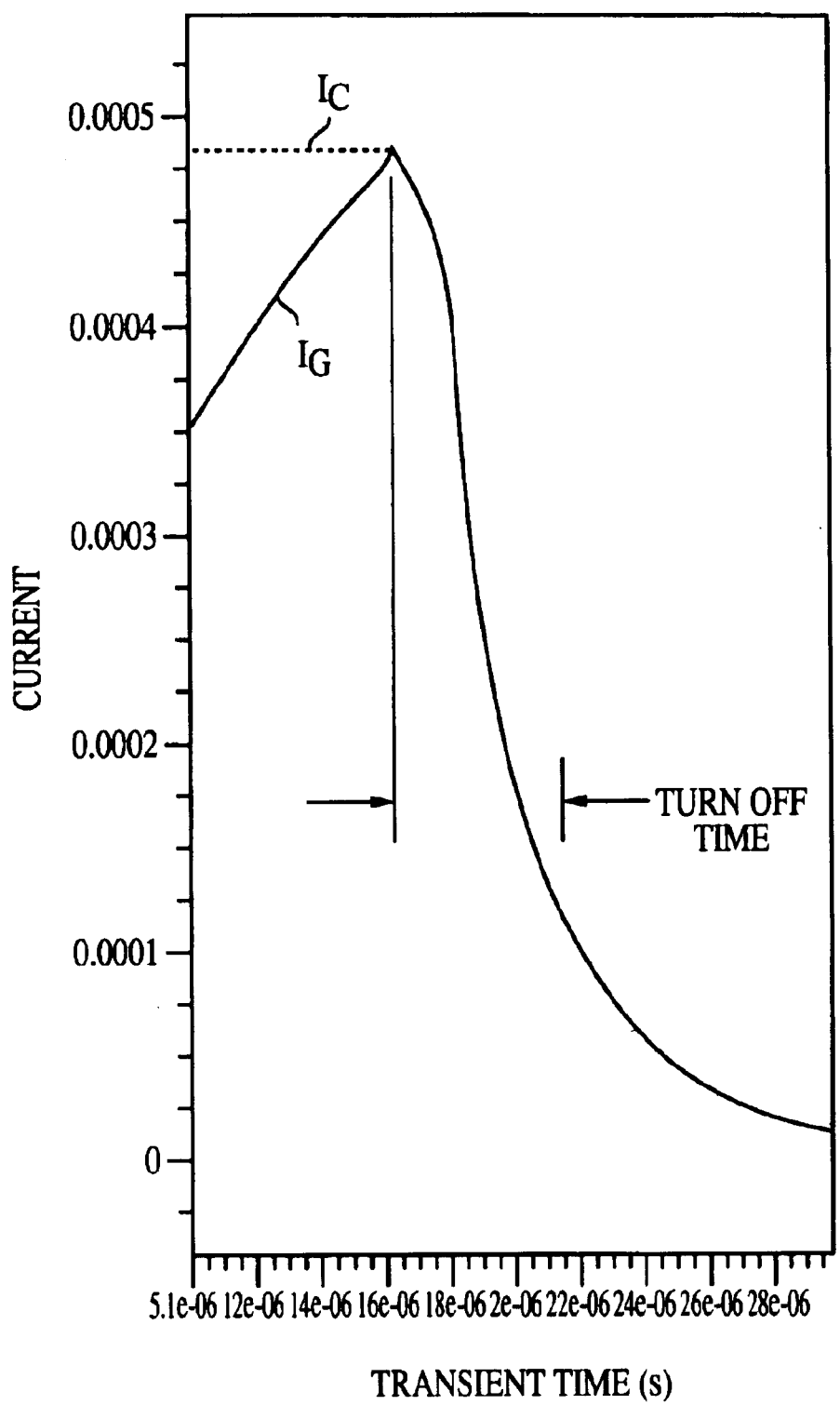
FIG. 6 shows a graph of the turn-off gain of a conventional SiC GTO when operating at higher cathode currents.
Figure 7:
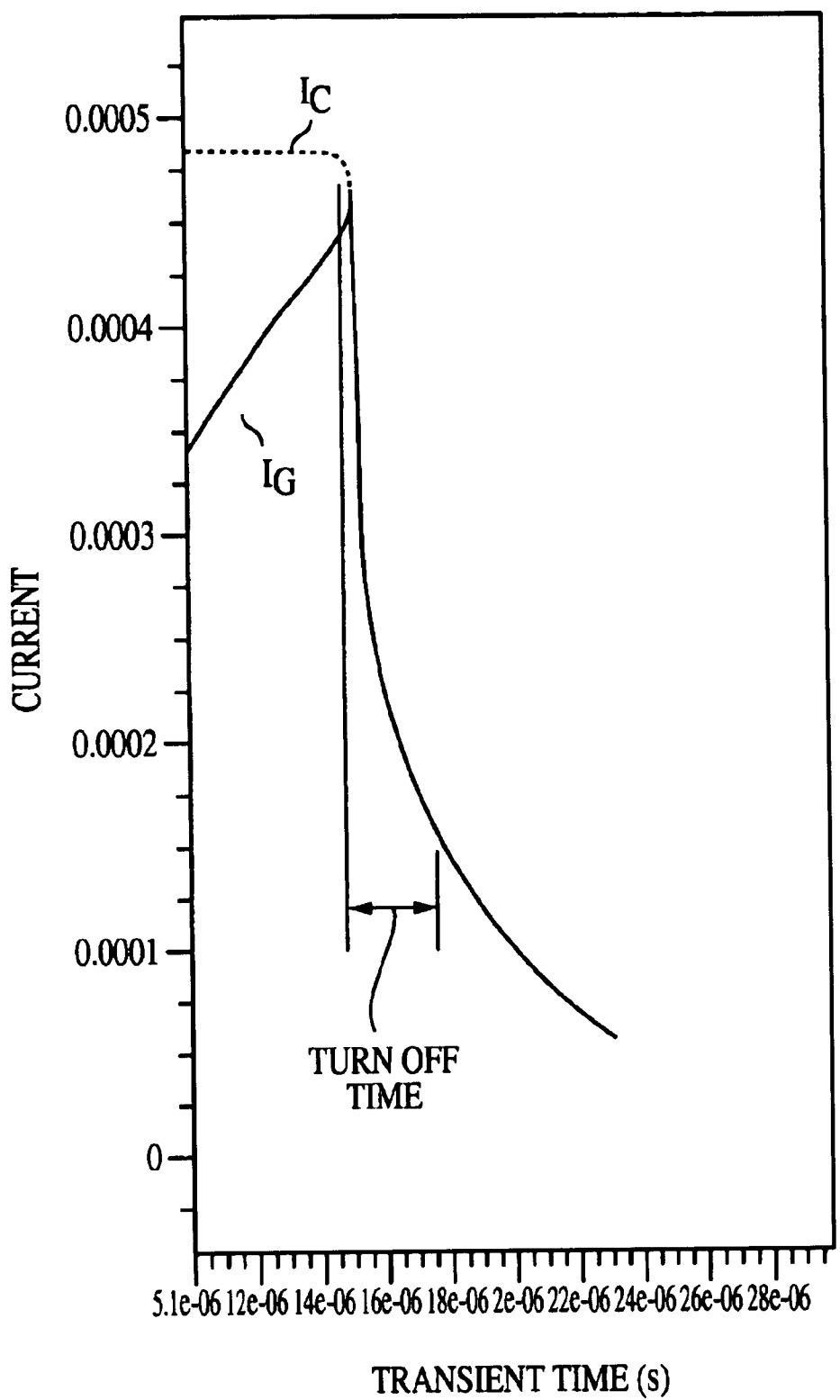
FIG. 7 shows a graph of the much improved turn-off gain of a preferred embodiment of the invention as shown in FIG. 2 when operating at higher cathode currents.

When the device is off, the voltage drop occurs over the low doped n-type drift region 118. In typical structures such as shown in FIG. 1, it occurs over the low doped p-type drift region 18. Larger blocking voltages can be seen by increasing the drift region thickness, but simulation results indicate that in all cases by making the drift region n-type the maximum blocked voltage will be larger than if the drift region was p-type as done with prior art devices. The improved voltage blocking performance is indicated in FIG. 3.

The preferred embodiment of FIG. 2 requires having region 120 (the p-type buffer layer) thicker than in prior art devices. Also it requires having the drift region 118 made of n-type instead of p-type material. Either of these improvements will result in better performance. The device turns-off as a gate turn-off thyristor because the gate turn-off operation occurs regardless of whether the low doped region adjacent to the n-type gated base region 114 is n-type or p-type. Significantly improved turn-off performance occurs because the thick region 120 now reduces the concentration of carriers in the drift region when the device is on, so it turns off faster. As seen in FIG. 3, voltage blocking performance is improved over prior art devices. The improved turn-off performance is demonstrated in FIGS. 4–7. In addition, improved performance resulting from increasing the thickness of the buffer region is expected in silicon thyristors as well.

This invention reduces the requirements on the control circuit at the gate by improving the turn-off gain. Also, it allows faster turn-off of SiC GTO thyristors. Furthermore, this invention will provide higher voltage blocking performance than conventionally designed SiC GTO thyristors of equal magnitude of drift region dopant concentrations and thickness because the n type material has a reduced impact ionization rate.

Having thus shown and described what are at present considered to be preferred embodiments of the present invention, it should be noted that the same have been made by way of illustration and not limitation. Accordingly, all modifications, alterations and changes coming within the spirit and scope of the present invention are herein meant to be included.

I claim:

1. A single gate silicon carbide gate-turn-off thyristor switchable between on and off states by a single gated base region comprising the following:

a p-type anode region;

a n-type gated base region positioned beneath the anode region;

a n-type drift region positioned beneath the gated base region and doped to a lower concentration of donors than that of the gated base region;

a p-type buffer region positioned beneath the n-type drift region and doped with acceptors to a concentration whose magnitude lies between the doping concentration of the anode region and the drift region;

an n-type substrate positioned beneath the buffer region; and a gate contact in direct contact with said n-type gated base region for providing gating control current flow therethrough.

2. A silicon carbide gate-turn-off thyristor according to claim 1, wherein the n-type drift region is doped to a concentration of $N_D < 4 \times 10^6$.

3. A silicon carbide gate-turn-off thyristor according to claim 2, wherein the n-type gated base region is doped to a concentration of $1 \times 10^{16} < N_D < 5 \times 10^{18}$.

4. A silicon carbide gate-turn-off thyristor according to claim 3, wherein the p-type buffer region is doped to a concentration of $1 \times 10^{17} < N_A < 1 \times 10^{19}$.

5. A silicon carbide gate-turn-off thyristor according to claim 4, wherein the p-type anode region is doped to a concentration of $N_A > 1 \times 10^{19}$.

6. A silicon carbide gate-turn-off thyristor according to claim 5, wherein the substrate region is doped to a concentration of $N_D < 5 \times 10^{18}$.

7. A silicon carbide gate-turn-off thyristor according to claim 1, further including:

a cathode contact on said n-type substrate; and an anode contact on said p-type anode region and spaced apart from said n-type gated base region for applying all anode current flow through said p-type anode region.

8. The silicon carbide gate-turn-off thyristor of claim 1 wherein:

said p-type buffer region is a thick buffer layer to reduce the amount of electron injection into the drift region.

9. The silicon carbide gate-turn-off thyristor of claim 8 wherein:

said p-type buffer region has a thickness of between 2.5 and 5 microns.

* * * * *